(12) United States Patent
Liao et al.

(10) Patent No.: US 8,838,660 B2
(45) Date of Patent: Sep. 16, 2014

(54) SYSTEMS AND METHODS FOR REDUCING FILTER SENSITIVITIES

(75) Inventors: Yu Liao, Longmont, CO (US); Hongwei Song, Longmont, CO (US); Lingyan Sun, Longmont, CO (US)

(73) Assignee: LSI Corporation, San Jose, CA (US)

( * ) Notice: Subject to any disclaimer, the term of this patent is extended or adjusted under 35 U.S.C. 154(b) by 915 days.

(21) Appl. No.: 12/972,942

(22) Filed: Dec. 20, 2010

(65) Prior Publication Data

US 2012/0158810 A1    Jun. 21, 2012

(51) Int. Cl.
  *G06F 17/10* (2006.01)
  *H03H 21/00* (2006.01)
  *G11B 20/10* (2006.01)

(52) U.S. Cl.
  CPC ....... *H03H 21/0012* (2013.01); *H03H 21/0067* (2013.01); *G11B 2220/2516* (2013.01); *G11B 20/10462* (2013.01); *G11B 20/10055* (2013.01)
  USPC ........................................................ 708/322

(58) Field of Classification Search
  CPC ........... H03H 21/0012; H03H 21/0043; H04L 25/03019
  USPC .................................................. 708/322, 323
  See application file for complete search history.

(56) References Cited

U.S. PATENT DOCUMENTS

| | | | | |
|---|---|---|---|---|
| 4,791,390 A * | 12/1988 | Harris et al. | ................. | 333/166 |
| 4,799,180 A * | 1/1989 | Suzuki | .......... | 708/323 |
| 4,947,362 A * | 8/1990 | Bui | .............. | 708/322 |
| 7,151,642 B2 * | 12/2006 | Ohkubo et al. | ................. | 360/65 |
| 7,197,146 B2 * | 3/2007 | Malvar et al. | ................... | 381/66 |
| 8,090,059 B1 * | 1/2012 | Song et al. | .................... | 375/341 |
| 8,179,956 B2 * | 5/2012 | Ooi | ............... | 375/232 |

* cited by examiner

*Primary Examiner* — Chuong D Ngo
(74) *Attorney, Agent, or Firm* — Hamilton DeSanctis & Cha

(57) ABSTRACT

Various embodiments of the present invention provide systems and methods for reducing filter sensitivities. As an example, reduced sensitivity filter circuits are discussed that include a digital filter and a filter tap adaptation circuit. The digital filter is operable to filter a received input based at least in part on a plurality of filter taps, and to provide a filtered output. The filter tap adaptation circuit is operable to receive an error value and a weighting control value, and to adaptively calculate at least one of the filter taps using the error value and the weighting control value.

19 Claims, 3 Drawing Sheets

SYSTEMS AND METHODS FOR REDUCING FILTER SENSITIVITIES

BACKGROUND OF THE INVENTION

The present inventions are related to data processing, and more particularly to systems and methods for filtering data.

In a typical read channel circuit a digital finite impulse response filter is used to filter a data set received from a storage medium. The filter taps provided to the digital finite impulse response filter are constrained using information developed during an optimization process. The resulting constraint is fixed and used during operation of the digital finite impulse response filter. In some cases, operation of the read channel circuit deviates from an expected standard rendering the fixed constraint less applicable resulting in degraded operation.

Hence, for at least the aforementioned reasons, there exists a need in the art for advanced systems and methods for data filtering.

BRIEF SUMMARY OF THE INVENTION

The present inventions are related to data processing, and more particularly to systems and methods for filtering data.

Various embodiments of the present invention provide reduced sensitivity filter circuits. Such circuits include a digital filter and a filter tap adaptation circuit. The digital filter is operable to filter a received input based at least in part on a plurality of filter taps, and to provide a filtered output. The filter tap adaptation circuit is operable to receive an error value and a weighting control value, and to adaptively calculate at least one of the filter taps using the error value and the weighting control value. In some instances of the aforementioned embodiments, the circuit is implemented as part of a storage device. Such a storage device may be, for example, a hard disk. In other cases, the circuit is implemented as part of a wireless receiver device. In some cases, the digital filter is a digital finite impulse response filter.

In various instances of the aforementioned embodiments, the weighting control value at least in part governs a frequency content used in the adaptive calculation. In some such cases, the weighting control value is programmable. In various instances of the aforementioned embodiments, the filter tap adaptation circuit is further operable to receive a first digital sample and a second digital sample. In such cases, the filter tap adaptation circuit adaptively calculates a delta value in accordance with the following equation:

$$\Delta_k = \Delta_{k-1} - \mu \cdot (e_k \cdot (X_{k,M+1} - X_{k,M-1}) \cdot w),$$

where w is the programmable weighting control value, $\mu$ is an adaptation gain value, $X_{k,M+1}$ is the first digital sample corresponding to the $(M+1)^{th}$ input to the digital filter, $X_{k,M-1}$ is the second digital sample corresponding to the $(M-1)^{th}$ input to the digital filter, $e_k$ is the error value, and $\Delta_{k-1}$ is the previously calculated delta value. In particular cases, circuit further comprises a buffer circuit that is operable to store the first digital sample and the second digital sample. In such cases, the filter tap adaptation circuit sets the delta value equal to a difference between a first tap of the filter taps and a second tap of the filter taps.

In some embodiments of the aforementioned embodiments, the circuits further include an analog to digital converter circuit that is operable to provide a series of digital samples to the digital filter circuit. In such cases, the difference between the first tap of the filter taps and the second tap of the filter taps is a filter constraint, and the filter constraint at least in part governs the phase of the samples provided by the analog to digital converter circuit.

In one or more instances of the aforementioned embodiments, the circuit further includes an error generation circuit operable to calculate the error value based at least in part on the filtered output. In some such cases, the circuit further includes a data detection circuit and a partial response target circuit. The data detection circuit is operable to perform a data detection on the filtered output to yield a detected output. The partial response target circuit is operable to convolve the detected output with a target to yield a partial response output. In such cases, the error generation circuit is operable calculate a difference between the filtered output and the partial response output to yield the error value.

Other embodiments of the inventions provide methods for data filtering that includes: receiving an analog input; converting the analog input to a series of digital samples; filtering the digital samples to yield filtered samples using a plurality of filter taps; and adaptively calculating at least one of the plurality of filter taps using an error value and a weighting control value.

Yet other embodiments of the inventions provide storage devices. Such storage devices include a storage medium operable to store information, a read/write head assembly disposed in relation to the storage medium, and a read channel circuit. The read/write head assembly is operable to sense the information and to provide an analog signal corresponding to the information. The read channel circuit includes: an analog to digital converter circuit, a digital filter, and a filter tap adaptation circuit. The analog to digital converter circuit is operable to receive a derivative of the analog signal and to provide a corresponding series of digital samples. The digital filter is operable to filter the series of digital samples based at least in part on a plurality of filter taps, and to provide a filtered output. The filter tap adaptation circuit is operable to receive an error value and a programmable weighting control value, and to adaptively calculate at least one of the filter taps using the error value and the programmable weighting control value.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to data processing, and more particularly to systems and methods for filtering data.

Figure 1:
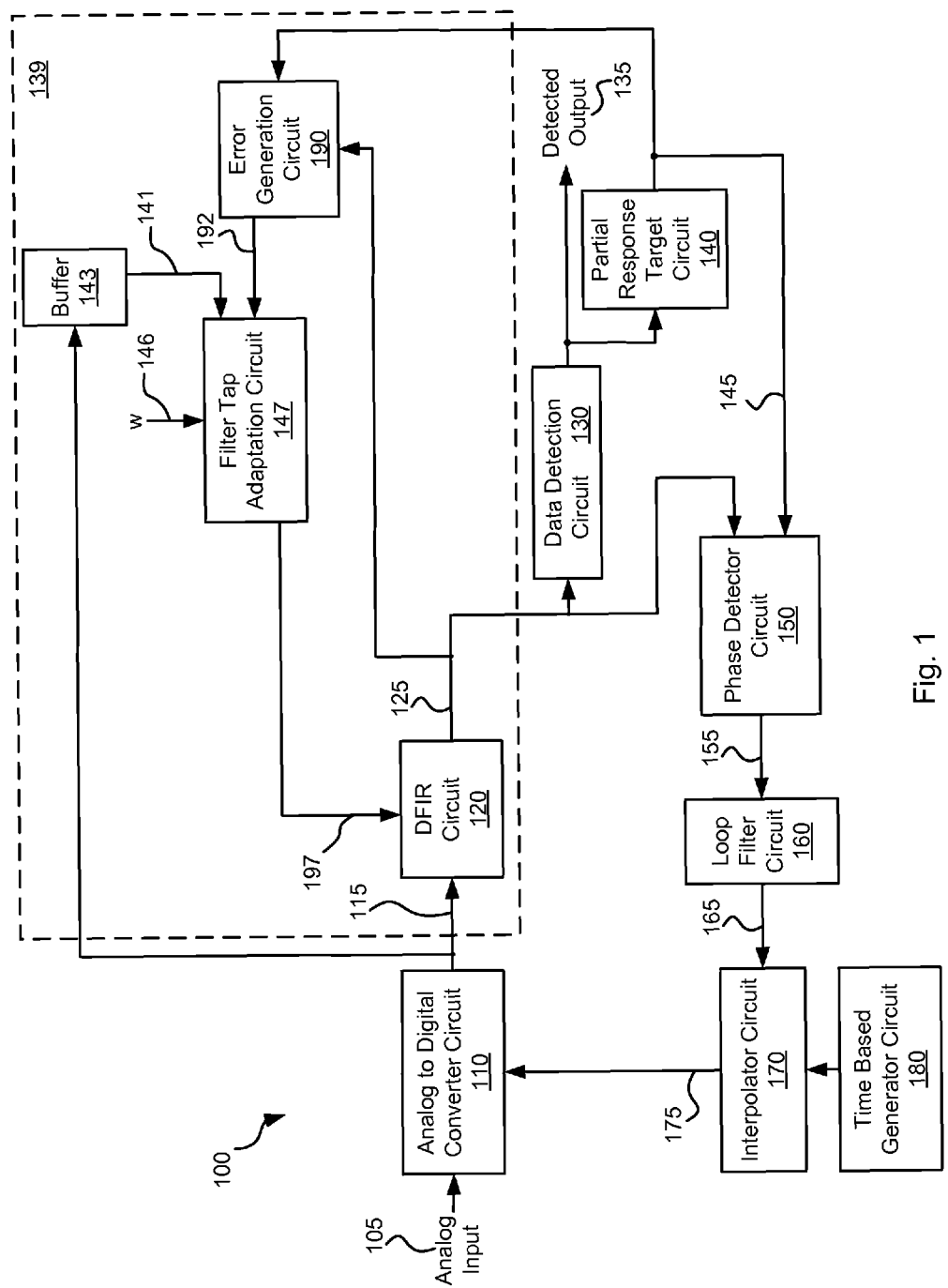
FIG. 1 depicts a data processing circuit including a reduced sensitivity filter circuit in accordance with one or more embodiments of the present invention.

Turning to FIG. 1, a data processing circuit 100 is depicted that includes a reduced sensitivity filter circuit 139 in accordance with one or more embodiments of the present invention. Data processing circuit 100 includes an analog to digital converter circuit 110 that converts an analog input signal 105 into a series of digital samples 115 that are provided to a digital finite impulse response (DFIR) circuit 120. DFIR circuit 120 filters the received input and provides a corresponding filtered output 125 to both a data detection circuit 130 and a phase detector circuit 150. Data detection circuit 130 performs a data detection process on the received input resulting in a detected output 135. In performing the detection process, data detection circuit 130 attempts to correct any errors in the received data input. Reduced sensitivity filter circuit 139 includes DFIR circuit 120, a filter tap adaptation circuit 147, an error generation circuit 190 and a buffer circuit 143

Detected output 135 is provided to a partial response target circuit 140 that creates a partial response output 145 compatible with filtered output 125 by convolving detected output 135 with a target. Detected output 135 is also provided to error generation circuit 190 that provides an error output 192 to filter tap adaptation circuit 147. Filter adaptation circuit 147 is provided with a programmable weighting control value w 146. Any error generation circuit known in the art may be used. For example, error generation circuit 190 may be a least mean square error calculation circuit as are known in the art. As another example, error generation circuit 190 may be a subtraction circuit operable to subtract partial response output 145 from filtered output 125 to yield error output 192. Based upon the disclosure provided herein, one of ordinary skill in the art will recognize a variety of error generation circuits that may be used in relation to different embodiments of the present invention.

Buffer circuit 143 stores a subset of digital samples 115. Buffer circuit 143 may be any device or circuit known in the art that is capable of storing information. In one particular embodiment of the present invention, buffer circuit 143 is a series of registers that each holds a respective one of digital samples 115. Filter tap adaptation circuit 147 receives error output 192 and buffered samples 141 from buffer circuit 143. Filter tap adaptation circuit 147 adaptively calculates filter taps 197 for DFIR circuit 120. In particular, filter tap adaptation circuit 147 calculates a delta value in accordance with the following equation:

$$\Delta_k = \Delta_{k-1} - \mu \cdot (e_k \cdot (X_{k,M+1} - X_{k,M-1}) \cdot w),$$

where w is programmable weighting control value 146 that may be modified to control the frequency content used in the adaptation, $\mu$ is an adaptation gain value, $X_{k,M+1}$ and $X_{k,M-1}$ are respective ones of digital samples 115 provided as the $(M+1)^{th}$ and $(M-1)^{th}$ inputs to DFIR circuit 120, $e_k$ is error output 192 from error generation circuit 190, and $\Delta_{k-1}$ is the previously calculated delta value. The aforementioned equation is derived by minimizing the mean square error at the output of DFIR circuit 120 in accordance with the following differential equation:

$$\frac{\partial(e^2)}{\partial \Delta} = \frac{\partial(e^2)}{\partial f_{(m+1)}} \cdot \frac{\partial f_{(m+1)}}{\partial f \Delta} + \frac{\partial(e^2)}{\partial f_{(m-1)}} \cdot \frac{\partial f_{(m-1)}}{\partial f \Delta} = \frac{1}{2}\left(\frac{\partial(e^2)}{\partial f_{(m+1)}} - \frac{\partial(e^2)}{\partial f_{(m-1)}}\right),$$

where $f_{(m+1)}$ and $f_{(m-1)}$ are respective ones of filter taps 197 provided to by filter tap adaptation circuit 147. Filter tap adaptation circuit 147 sets $\Delta_k$ equal to the difference between taps $f_{k,(m+1)}$ and $f_{k,(m-1)}$, where the difference between the aforementioned taps is a constraint governing the operation of DFIR circuit 120. Where stable circuit operation occurs, $\Delta_k$ eventually converges.

Ultimately, filter taps 197 are applied to DFIR circuit 120 to control the filtering operation. Adaptively constraining filter taps 197 reduces the sensitivities of data processing circuit 100 to electrical and environmental changes in analog input 105 caused by upstream processing circuitry (not shown) that yields analog input 105. The aforementioned constraint (i.e., forcing a defined difference between the selected filter taps, e.g., $f_{k,(m+1)}$ and $f_{k,(m-1)}$) of the digital filter operates to control the phase of the samples derived from analog to digital converter circuit 110. In one particular embodiment of the present invention, $f_{k,(m+1)}$ and $f_{k,(m-1)}$ are respectively the fifth and the third filter taps. By adapting the constraint as discussed herein, DFIR circuit 120 (or another digital filter used in its place) is less sensitive to analog component variations occurring in the semiconductor manufacturing process and/or environmental change.

Phase detector circuit 150 determines a phase difference between partial response output 145 and filtered output 125 and yields a phase error output 155. When timing recovery loop circuit 100 is properly synchronized to analog input 105, phase error output 155 goes to zero. Phase error output 155 is provided to a loop filter circuit 160 that filters the received input and provides a corresponding filtered output 165. Filtered output 165 is provided to an interpolator circuit 170 that is operable to determine an optimal sampling phase/frequency for a sampling clock 175. Sampling clock 175 is based on a clock input provided by a time based generator circuit 180. The next instance of analog input 105 is sampled by analog to digital converter circuit 110 synchronous to sampling clock 175.

Figure 2:
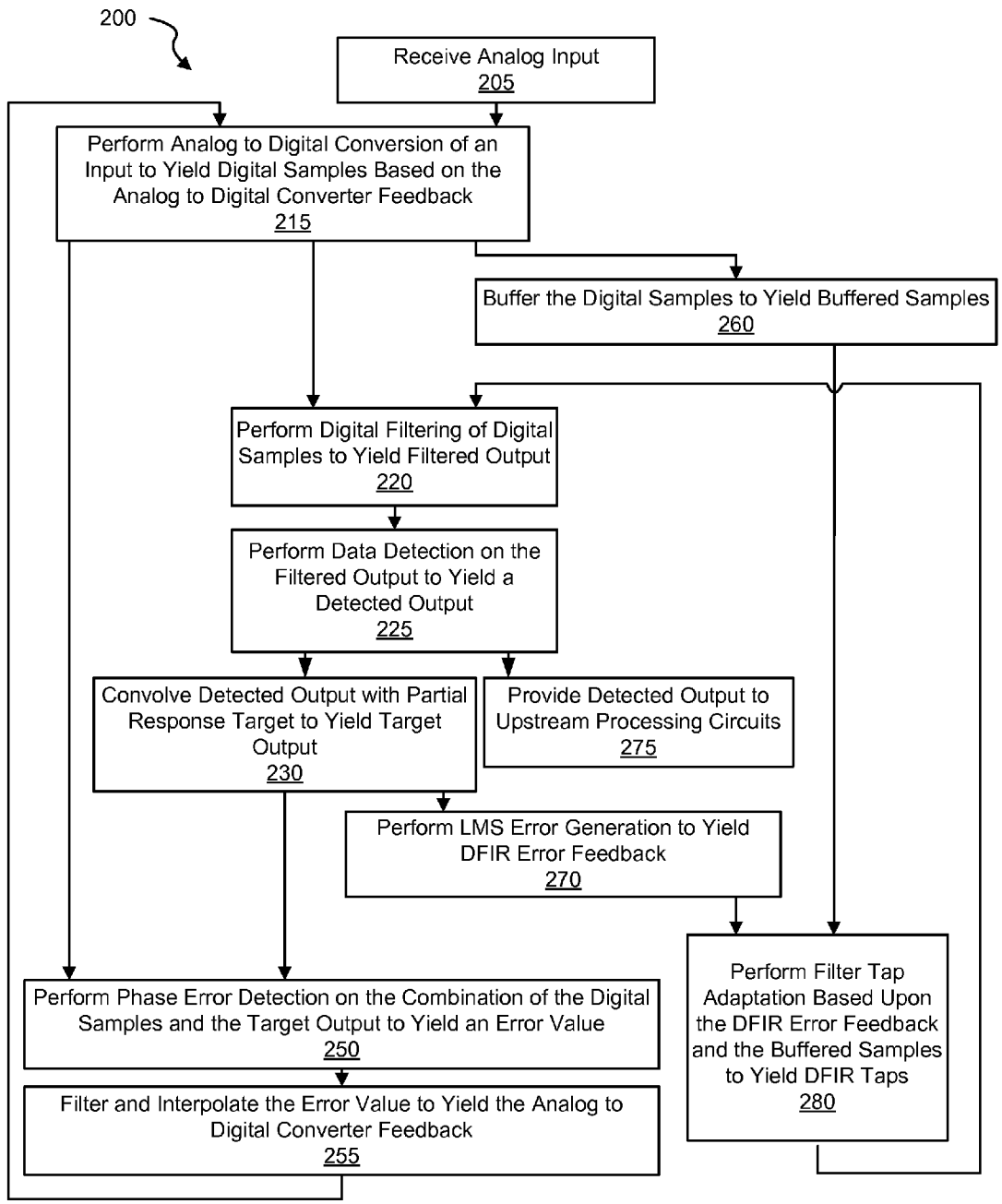
FIG. 2 shows a method for reduced sensitivity filtering in accordance with some embodiments of the present invention.

Turning to FIG. 2, a flow diagram 200 shows a method for reduced sensitivity filtering in accordance with some embodiments of the present invention. Following flow diagram 200, an analog input is received (block 205). In some cases, the analog input signal is derived from a storage medium. In other cases, the analog input signal is derived from a transmission medium. Based upon the disclosure provided herein, one of ordinary skill in the art will recognize other sources from which the analog input signal may be derived. An analog to digital conversion is performed on the analog input to yield a series of digital samples (block 215). The digital samples are generated synchronous to a sample clock that is adjusted based upon an analog to digital converter feedback from generated from previous processing.

The digital samples are buffered (block 260). The buffering may be done using any storage circuit or device known in the art, and the buffering yields buffered samples. In addition, digital filtering is applied to the digital samples to yield a filtered output (block 220). In some embodiments of the present invention, the digital filtering is done by a digital finite impulse response circuit as is known in the art. A data detection process is then applied to the filtered output to yield a detected output (block 225). The detection process may be any data detection process known in the art including, but not limited to, a Viterbi algorithm detection process or a maximum a posteriori detection process. The resulting detected output is provided both as an output to an downstream processing circuit (block 275) and to a convolution filter circuit (block 230). The convolution filter circuit convolves the detected output with a partial response target to yield a target output. Using the target output, a least mean squared error is generated and the error is filtered to yield a DFIR error feedback (block 270).

The buffered samples (block 260) along with the DFIR error feedback (block 270) are used to adaptively calculate DFIR taps (block 280). The adaptive calculation calculates a delta value in accordance with the following equation:

$$\Delta_k = \Delta_{k-1} - \mu \cdot (e_k \cdot (X_{k,M+1} - X_{k,M-1}) \cdot w),$$

where w is a programmable weighting control value that may be modified to control the frequency content used in the adaptation, $\mu$ is an adaptation gain value, $X_{k,M+1}$ and $X_{k,M-1}$ are respective ones of the buffered samples (block 260) that are provided as the $(M+1)^{th}$ and $(M-1)^{th}$ inputs to digital filtering process (block 220), $e_k$ is the DFIR error feedback (block 270), and $\Delta_{k-1}$ is the previously calculated delta value. The aforementioned equation is derived by minimizing the mean square error in the filtered output in accordance with the following differential equation:

$$\frac{\partial(e^2)}{\partial\Delta} = \frac{\partial(e^2)}{\partial f_{(m+1)}} \cdot \frac{\partial f_{(m+1)}}{\partial f\Delta} + \frac{\partial(e^2)}{\partial f_{(m-1)}} \cdot \frac{\partial f_{(m-1)}}{\partial f\Delta} = \frac{1}{2}\left(\frac{\partial(e^2)}{\partial f_{(m+1)}} - \frac{\partial(e^2)}{\partial f_{(m-1)}}\right),$$

where $f_{(m+1)}$ and $f_{(m-1)}$ are respective ones of the filter taps used by the digital filtering process (block 220). Ultimately, the filter tap adaptation process sets $\Delta_k$ equal to the difference between taps $f_{k,(m+1)}$ and $f_{k,(m-1)}$, where the difference between the aforementioned taps is a constraint governing the operation of the digital filtering process (block 220). Where stable circuit operation occurs, $\Delta_k$ eventually converges. The DFIR taps corresponding to the calculated delta value are fed back to the digital filtering process (block 220) to govern the applied digital filtering. The weighting control value (w) may be used to control frequency content in accordance with the following pseudocode:

```
If (|(Xk,M+1 − Xk,M−1) · w| ▷ Threshold)
{
    Set (Xk,M+1 − Xk,M−1) · w equal to 0; and
    Set Δk = Δk−1
}
Else
{
    Δk = Δk−1 − μ · (ek · (Xk,M+1 − Xk,M−1) · w)
}
```

In addition, a phase error detection is performed to detect a phase difference between the digital samples (block 215) and the target output (block 230) to yield an error value (block 250). The phase error detection may be performed using any phase error detection circuit known in the art. The error value is then filtered and interpolated using processes known in the art to yield an analog to digital converter feedback (block 255). The analog to digital converter feedback governs the sampling phase/frequency of the analog to digital converter.

Figure 3:
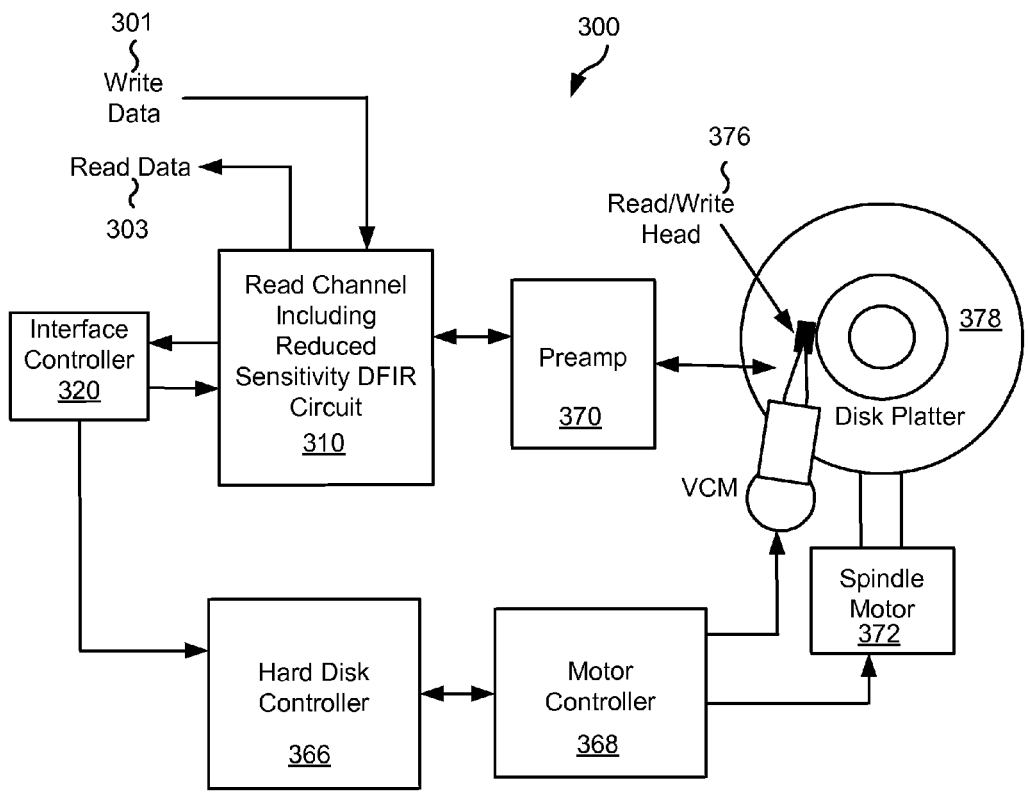
FIG. 3 shows a storage system including a read channel circuit with a read channel circuit with a reduced sensitivity digital finite impulse response circuit is shown in accordance with some embodiments of the present invention.

Turning to FIG. 3, a storage system 300 including a read channel circuit 310 with a reduced sensitivity digital finite impulse response circuit is shown in accordance with some embodiments of the present invention. Storage system 300 may be, for example, a hard disk drive. Storage system 300 also includes a preamplifier 370, an interface controller 320, a hard disk controller 366, a motor controller 368, a spindle motor 372, a disk platter 378, and a read/write head assembly 376. Interface controller 320 controls addressing and timing of data to/from disk platter 378. The data on disk platter 378 consists of groups of magnetic signals that may be detected by read/write head assembly 376 when the assembly is properly positioned over disk platter 378. In one embodiment, disk platter 378 includes magnetic signals recorded in accordance with either a longitudinal or a perpendicular recording scheme.

In a typical read operation, read/write head assembly 376 is accurately positioned by motor controller 368 over a desired data track on disk platter 378. Motor controller 368 both positions read/write head assembly 376 in relation to disk platter 378 and drives spindle motor 372 by moving read/write head assembly to the proper data track on disk platter 378 under the direction of hard disk controller 366. Spindle motor 372 spins disk platter 378 at a determined spin rate (RPMs). Once read/write head assembly 376 is positioned adjacent the proper data track, magnetic signals representing data on disk platter 378 are sensed by read/write head assembly 376 as disk platter 378 is rotated by spindle motor 372. The sensed magnetic signals are provided as a continuous, minute analog signal representative of the magnetic data on disk platter 378. This minute analog signal is transferred from read/write head assembly 376 to read channel circuit 310 via preamplifier 370. Preamplifier 370 is operable to amplify the minute analog signals accessed from disk platter 378. In turn, read channel circuit 310 decodes and digitizes the received analog signal to recreate the information originally written to disk platter 378. This data is provided as read data 303 to a receiving circuit. As part of decoding the received information, read channel circuit 310 filters the received data using the aforementioned reduced sensitivity digital finite impulse response circuit. The reduced sensitivity digital finite impulse response circuit may be implemented similar to that described above in relation to FIG. 1 above, and/or the reduced sensitivity digital finite impulse response filtering may be done in accordance with the methods of FIG. 2 described above. A write operation is substantially the opposite of the preceding read operation with write data 301 being provided to read channel circuit 310. This data is then encoded and written to disk platter 378.

It should be noted that storage system 300 may be integrated into a larger storage system such as, for example, a RAID (redundant array of inexpensive disks or redundant array of independent disks) based storage system. It should also be noted that various functions or blocks of storage system 300 may be implemented in either software or firmware, while other functions or blocks are implemented in hardware.

Figure 4:
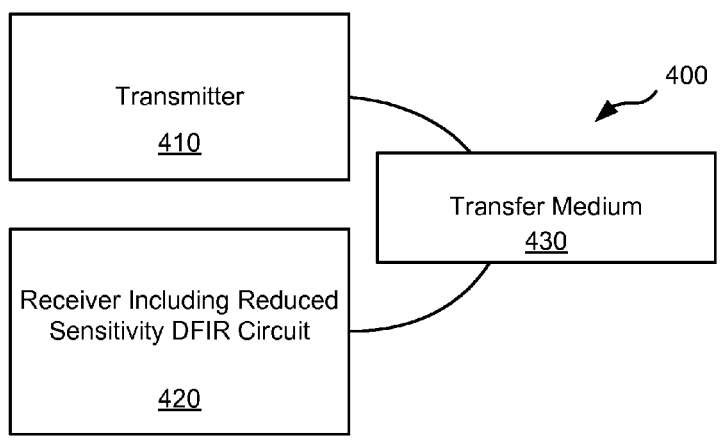
FIG. 4 shows including a receiver with a reduced sensitivity digital finite impulse response circuit is shown in accordance with some embodiments of the present invention.

Turning to FIG. 4, a wireless communication system 400 including a receiver 420 with a reduced sensitivity digital finite impulse response circuit is shown in accordance with some embodiments of the present invention. Communication system 400 includes a transmitter 410 that is operable to transmit encoded information via a transfer medium 430 as is known in the art. The encoded data is received from transfer medium 430 by receiver 420. Receiver 420 incorporates the reduced sensitivity digital finite impulse response circuit that may be implemented similar to that described in FIG. 1 above, and/or the reduced sensitivity digital finite impulse response filtering may be done in accordance with the methods described in relation to FIG. 3 above.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data filtering. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A reduced sensitivity filter circuit, the circuit comprising:
a digital filter operable to filter a received input based at least in part on a plurality of filter taps, and to provide a filtered output; and
a filter tap adaptation circuit operable to receive an error value, a weighting control value, a first digital sample derived from the received input and a second digital sample derived from the received input; and to adaptively calculate at least one of the filter taps using the error value and the weighting control value, wherein adaptively calculating the at least one of the filter taps includes adaptively calculating an updated delta value by subtracting a modification value from a previously calculated delta value to yield the updated delta value, wherein the modification value is calculated based at least in part upon the first digital sample and the second digital sample, and wherein the filter tap adaptation circuit sets a difference between a first tap of the plurality filter taps and a second tap of the plurality of filter taps equal to the updated delta value.

2. The circuit of claim 1, wherein the circuit is implemented as part of a storage device.

3. The circuit of claim 2, wherein the storage device is a hard disk.

4. The circuit of claim 1, wherein the circuit is implemented as part of a wireless receiver device.

5. The circuit of claim 1, wherein the weighting control value at least in part governs a frequency content used in the adaptive calculation.

6. The circuit of claim 5, wherein the weighting control value is programmable.

7. The circuit of claim 1, wherein the filter tap adaptation circuit adaptively calculates the updated delta value in accordance with the following equation:

$$\Delta_k = \Delta_{k-1} - \mu \cdot (e_k \cdot (X_{k,M+1} - X_{k,M-1}) \cdot w),$$

wherein w is the programmable weighting control value, $\mu$ is an adaptation gain value, $X_{k,M+1}$ is the first digital sample corresponding to the $(M+1)^{th}$ input to the digital filter, $X_{k,M-1}$ is the second digital sample corresponding to the $(M-1)^{th}$ input to the digital filter, $e_k$ is the error value, $\Delta_{k-1}$ is the previously calculated delta value, and $\Delta_k$ is the updated delta value.

8. The circuit of claim 7, wherein circuit further comprises:
a buffer circuit, wherein the buffer circuit is operable to store the first digital sample and the second digital sample.

9. The circuit of claim 7, wherein the programmable weighting control value controls frequency content in accordance with the following pseudocode:

```
If (|(Xk,M+1 − Xk,M−1) · w| ▷ Threshold)
{
    Set (Xk,M+1 − Xk,M−1) · w equal to 0; and
    Set Δk = Δk−1
}
Else
{
    Δk = Δk−1 − μ · (ek · (Xk,M+1 − Xk,M−1) · w)
}.
```

10. The circuit of claim 1, wherein the circuit further comprises:
an analog to digital converter circuit operable to provide a series of digital samples to the digital filter circuit;
wherein the difference between the first tap of the filter taps and the second tap of the filter taps is a filter constraint; and
wherein the filter constraint at least in part governs the phase of the samples provided by the analog to digital converter circuit.

11. The circuit of claim 1, wherein the digital filter is a digital finite impulse response filter.

12. The circuit of claim 1, wherein the circuit further comprises:
an error generation circuit operable to calculate the error value based at least in part on the filtered output.

13. The circuit of claim 12, wherein the circuit further comprises:
a data detection circuit operable to perform a data detection on the filtered output to yield a detected output;
a partial response target circuit operable to convolve the detected output with a target to yield a partial response output; and
wherein the error generation circuit is operable calculate a difference between the filtered output and the partial response output to yield the error value.

14. The circuit of claim 1, wherein the circuit is implemented as part of a integrated circuit.

15. A method for data filtering, the method comprising:
receiving an analog input;
converting the analog input to a series of digital samples including at least a first digital sample and a second digital sample;
filtering the digital samples to yield filtered samples using a plurality of filter taps; and
adaptively calculating at least one of the plurality of filter taps using an error value and a weighting control value, wherein adaptively calculating the at least one of the plurality of filter taps includes adaptively calculating an updated delta value by subtracting a modification value from a previously calculated delta value to yield the updated delta value, wherein the modification value calculated based at least in part upon the first digital sample and the second digital sample, and wherein adaptively calculating the at least one of the plurality of filter taps further includes setting a difference between a first tap of the filter taps and a second tap of the of filter taps equal to the updated delta value.

16. The method of claim 15, wherein the method further comprises:
   performing a data detection on the filtered samples to yield a detected output;
   convolving the detected output with a target to yield a partial response output; and
   calculating the error value using the partial response output and the filtered samples.

17. The method of claim 15, wherein adaptively calculating the updated delta value is done in accordance with the following equation:

$$\Delta_k = \Delta_{k-1} - \mu \cdot (e_k \cdot (X_{k,M+1} - X_{k,M-1}) \cdot w),$$

wherein w is the programmable weighting control value, $\mu$ is an adaptation gain value, $X_{k,M+1}$ is the first digital sample corresponding to the $(M+1)^{th}$ input to the digital filter, $X_{k,M-1}$ is the second digital sample corresponding to the $(M-1)^{th}$ input to the digital filter, $e_k$ is the error value, $\Delta_{k-1}$ is the previously calculated delta value, and $\Delta_k$ is the updated delta value.

18. The method of claim 16, wherein the difference between the first tap of the filter taps and the second tap of the filter taps is a filter constraint, and wherein the filter constraint at least in part governs converting the analog input.

19. A storage device, the storage device comprising:
a storage medium operable to store information;
a read/write head assembly disposed in relation to the storage medium, wherein the read/write head assembly is operable to sense the information and to provide an analog signal corresponding to the information; and
a read channel circuit including:
   an analog to digital converter circuit operable to receive a derivative of the analog signal and to provide a corresponding series of digital samples;
   a digital filter operable to filter the series of digital samples based at least in part on a plurality of filter taps, and to provide a filtered output; and
   a filter tap adaptation circuit operable to receive an error value, a weighting control value, a first digital sample derived from the received input and a second digital sample from the series of digital samples; and to adaptively calculate at least one of the filter taps using the error value and the weighting control value, wherein adaptively calculating the at least one of the filter taps includes adaptively calculating an updated delta value by subtracting a modification value from a previously calculated delta value to yield the updated delta value, and wherein the filter tap adaptation circuit sets a difference between a first tap of the plurality filter taps and a second tap of the plurality of filter taps equal to the updated delta value.

* * * * *